United States Patent [19]

Hubler et al.

[11] 4,262,056
[45] Apr. 14, 1981

[54] ION-IMPLANTED MULTILAYER OPTICAL INTERFERENCE FILTER

[75] Inventors: Graham K. Hubler, Fairfax, Va.; Philip R. Malmberg, Oxon Hill, Md.; Theoren P. Smith, III, Spring Valley, Calif.

[73] Assignee: The United States of America as represented by the Secretary of the Navy, Washington, D.C.

[21] Appl. No.: 942,858

[22] Filed: Sep. 15, 1978

[51] Int. Cl.³ .......................................... B05D 3/06
[52] U.S. Cl. .................................. 428/446; 428/448; 350/1.7; 427/38; 427/39; 427/162; 427/164; 427/167; 427/94; 148/1.5
[58] Field of Search .............. 428/446, 448; 427/38, 427/39, 162, 164, 167, 94; 350/1.7; 148/1.5

[56] References Cited

U.S. PATENT DOCUMENTS

| | | | |
|---|---|---|---|
| 3,666,548 | 5/1972 | Brack | 427/38 |
| 3,721,584 | 3/1973 | Diem | 350/1.7 |
| 3,962,062 | 6/1976 | Ingrey | 350/164 |
| 3,976,511 | 8/1976 | Johnson | 357/49 |
| 3,976,512 | 8/1976 | DeNora | 357/88 |
| 4,016,007 | 4/1977 | Wada | 427/94 |
| 4,145,457 | 3/1979 | Kersten | 427/38 |

FOREIGN PATENT DOCUMENTS 1164352  9/1969  United Kingdom ............ 350/1

*Primary Examiner*—Ellis P. Robinson
*Attorney, Agent, or Firm*—Richard S. Sciascia; William T. Ellis; Melvin L. Crane

[57] ABSTRACT

A single or multilayer optical interference filter and method of forming the filter by ion implantation. One or more layers of nitrogen ions are implanted into a single crystal silicon with the crystal at a temperature of from about 600° C. to about 1000° C. The implanted ions create a buried layer(s) of silicon nitride ($Si_3N_4$) whose refractive index is substantially different from that of silicon (Si) such that appreciable multiple reflection of incident light occurs between the buried layer(s) and the front surface. The resulting interference maxima and minima in transmitted or reflected light which occur at well-defined positions in wavelength may be controlled both in amplitude and wavelength position. The ions may be implanted in layers at different depths to produce a "thin film" interference filter.

8 Claims, 4 Drawing Figures

ION-IMPLANTED MULTILAYER OPTICAL INTERFERENCE FILTER

BACKGROUND OF THE INVENTION

This invention relates to optical interference filters and more particularly to ion-implanted single or multilayer optical interference filters.

Heretofore optical filters have been made by sputtering or by other methods of depositing materials of differing refractive index onto a transparent substrate. Such structures work well for low-power light application; however, for high-power illumination the deposited films peel-off or crack. Such a structure is found in U.S. Pat. No. 3,962,062 in which the films are deposited by sputtering.

Electrically insulated integrated circuits (U.S. Pat. No. 3,976,511) have been formed by bombarding the surface of a substrate by ions and then heating the resultant bombarded surface sufficiently to react the ions with the substrate. The structure is further formed by depositing a layer onto the ion-bombarded structure and then forming desired patterns of electrically insulating layers thereon. U.S. Pat. No. 3,976,512 also illustrates ion bombardment in forming integrated circuits.

SUMMARY OF THE INVENTION

A thin-film interference optical filter is formed by preheating a substrate to a temperature of from about 600° C. to about 1000° C. and bombarding the substrate with desired ions while maintaining the substrate at the preheated temperature. The ions are implanted a desired distance within the substrate so that incident radiation is reflected between the ion-implanted layer and the upper surface of the substrate.

Such implanted layers can withstand high temperatures and will not peel-off and the devices will pass the "SCOTCH TAPE" test such as used in the solar cell industry.

DETAILED DESCRIPTION

Figure 1:
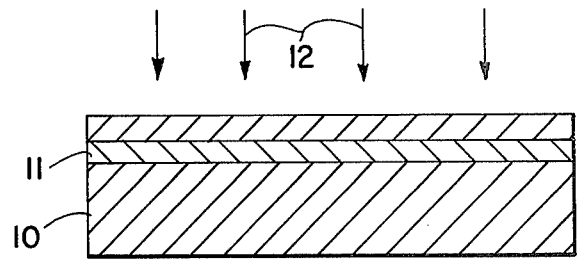
FIG. 1 illustrates an ion-bombarded substrate which forms a single implanted ion layer.

FIG. 1 illustrates a high-resistivity (>10 ohm-cm) silicon substrate 10 with one layer 11 of nitrogen ions implanted therein a short distance from and parallel with the upper surface of the substrate. An ion accelerator is used to accelerate nitrogen ions 12, having an energy from about 10 KeV to about 100 MeV, which are uniformly incident on the surface of the silicon substrate. The ions penetrate the surface of the substrate and form a layer below the surface, the depth of which depends on the ion energy, and the concentration of which depends on the total number of incident ions per square cm. The substrate is heated to a temperature of from about 600° C. to about 1000° C. prior to implantation and maintained at a constant temperature during implantation. At this temperature the radiation damage produced by the implanted ions anneals out so that the crystallinity of the original single-crystal silicon is maintained, and the optical properties of the layer overlying the implanted layer are those of pure crystalline silicon. In the buried implanted layer, a substrate temperature of about 700° C. efficiently promotes the formation of the second-phase material (ion layer), silicon nitride, whose refractive index is 2.0. Thus silicon, with an index of refraction of 3.43, has a layer of silicon nitride with an index of refraction of 2.0 buried beneath the surface. With the above-mentioned ion energy it takes from 3 to 5 hours to form a layer.

The large difference in the index of refraction of the main body and the ion-implanted layer will cause light to be multiply reflected between the Si$_3$N$_4$ layer and the upper surface of the substrate. These multiple reflections lead to interference maxima and minima in the transmitted light as a function of wavelength.

Figure 2:
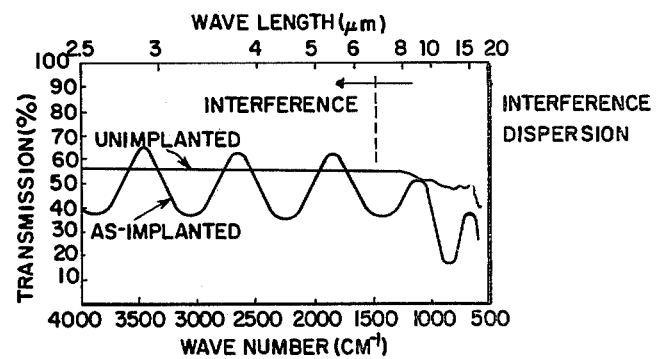
FIG. 2 is an infrared transmission spectrum of silicon implanted with 1.5 MeV nitrogen ions to a fluence of $1.25 \times 10^{18}$ ions/cm$^2$ compared with an unimplanted filter.

FIG. 2 illustrates the infrared transmission spectrum of a Si substrate implanted with ions at 1.5 MeV to a fluence of $1.25 \times 10^{18}$ ions/cm$^2$ relative to a transmission of an unimplanted substrate. The substrate is heated to a temperature of about 700° C. prior to implantation and is maintained at about 700° C. during ion implantation. The oscillations in the transmission are the result of light which has been multiply reflected between the front surface of the Si and the buried layer whose index of refraction is different from that of the substrate. The concentration profile of nitrogen ions in the buried layer is gaussian-shaped, the refractive index profile is likewise gaussian-shaped with the peak of the gaussian at 1.85 μm in this case, and the standard deviation of the gaussian is 0.1 μm. The refractive index profile is inverted with respect to the nitrogen concentration profile so that the refractive index at the peak of the gaussian is 2.0, and, at four standard deviations from the centroid, the refractive index has merged with that of crystalline silicon and is equal to 3.43.

Figure 3:
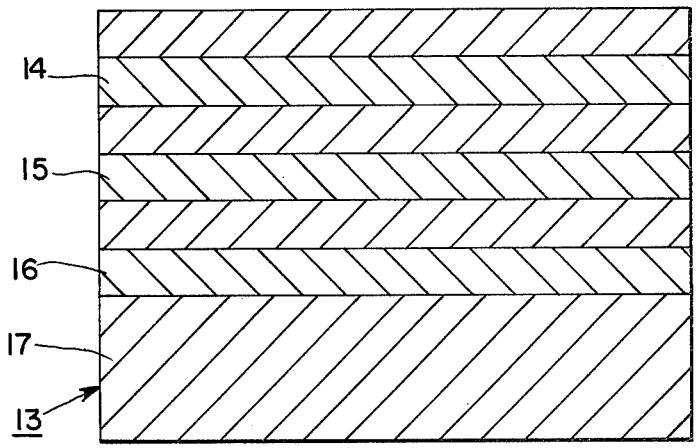
FIG. 3 illustrates a three-layer, ion-implanted, quarter-wave-stack interference filter.

FIG. 3 illustrates a quarter-wave-stack interference filter 13 formed by three separate layers 14, 15, 16 of nitrogen ions implanted in a silicon substrate.

Layer 14 is formed by implanting nitrogen at an energy of 0.67 MeV to a fluence of $1.0 \times 10^{18}$ ions/cm$^2$ and is in a gaussian-shape layer centered at a depth of 1.1 μm. Such a layer takes about 3 hours to form. Layer 15 is produced by implanting at an energy of 1.51 MeV to a fluence of $1.28 \times 10^{18}$ ions/cm$^2$ and its depth is 1.84 μm. Layer 16 is formed by implanting at an energy of 2.5 MeV to a fluence of $1.46 \times 10^{18}$ ions/cm$^2$ resulting in a depth of 2.55 μm. Notice that the spacings between layers 14-15 and 15-16 are equal and are computed to yield a reflection maximum at 3.8 μm. The substrate temperature was held at 700° C. during these implantations. Implanted layers such as set forth above can be formed in about 3-5 hours. More layers could be implanted if it were deemed necessary to do so. Theory and experiment show that as more layers are added, the reflection maximum increases. The order in which the lowermost or uppermost layer is formed is not important; they may be implanted in either order.

Figure 4:
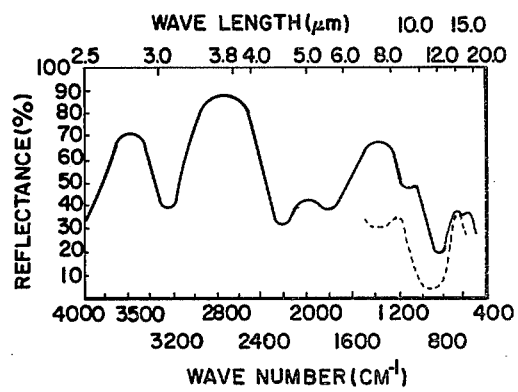
FIG. 4 is an infrared reflectance spectrum of an ion-implanted three-layer quarter-wave-stack interference filter designed to have maximum reflectance at 3.8 μm.

If the quarter-wave-stack interference filter has alternating layers of high and low refractive index, and equal optical paths of λ/4 in each layer, then a reflection maximum will occur at the wavelength λ. With a refractive index of 3.43 for silicon and 2.0 for each of the implanted ion layers, a three-layer quarter-wave-stack designed to have a reflection maximum at 3.8 μm will have a reflectivity of from 87% to 95% for well-characterized discrete layers. FIG. 4 illustrates an infrared reflection spectrum of a 3.8 μm three-layer reflection interference filter fabricated as set forth above. The curve shows filtering behavior reaching above a maximum of about 90%.

In operation radiation is incident on the surface of the filter and the radiation that is filtered out is reflected back-and-forth between the implanted layer and the surface of the filter. That radiation which is not reflected back-and-forth will pass through the filter.

The filter can be made for maximum reflection of radiation at different wavelengths by making filters with ion-implanted layers at different depths and of different thickness. For instance, the curve of maximum reflection, as shown in FIG. 4 could be moved to the left or right along the wavelength line by the above-noted changes.

It has been determined that such filters are environmentally stable and temperature-stable. Annealing the finished filter for 1 hour at 1000° C. in vacuo produced negligible changes in the optical properties. The filters will pass the "Scotch Tape" test used in the solar industry to test adherence of antireflective coatings. No peeling or spalling of the surface occurs because the implanted ion layers are an integral part of the substrate.

This invention has been described using silicon in which nitrogen ions have been implanted. It will be obvious to others that other materials such as glass, GaAs, ZnSe, $CaF_2$ and other infrared optical window materials may be used.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of forming an optical interference filter comprising:
    heating a transparent substrate to a temperature from about 600° C. to about 1000° C. prior to ion bombardment of said substrate and maintaining that temperature during ion bombardment while forming said filter;
    bombarding said heated substrate with ions at an energy level from about 10 KeV to about 100 MeV sufficient to result in ion penetrations to a plurality of selected depths to produce a plurality of ion-implanted layers within said substrate, the bombardment being continued for a time sufficient to produce an ion concentration in said layer of at least a fluence of $1.25 \times 10^{18}$ ions/cm² with the ions dispersed in the layers so that the ions combine with said substrate to become an integral part thereof.

2. A method as claimed in claim 1 wherein:
    the upper surface of said uppermost ion layer within said substrate is about 2 μm from the upper surface of said substrate.

3. A method as claimed in claim 1 wherein:
    said ions are nitrogen ions.

4. A method as claimed in claim 3 wherein:
    said substrate is silicon.

5. A method as claimed in claim 3 wherein:
    said implanted nitrogen ions react with said silicon to form $Si_3N_4$ with an index of refraction of 2.0.

6. An optical interference filter which is peel and spall resistant comprising:
    a transparent substrate;
    a plurality of implanted spaced layers within said substrate;
       each of said spaced layers initially including ions which are dispersed throughout said layer of said substrate such that the ions react with said substrate to form a compound comprising said ions and said substrate atoms and becomes an integral part of said substrate,
       each of said spaced layers formed by ions having a fluence of at least $1.0 \times 10^{18}$ ions/cm² implanted in said substrate at desired distances from and parallel with one surface of said substrate.

7. An optical interference filter as claimed in claim 6 in which:
    said ions are nitrogen ions.

8. An optical interference filter as claimed in claim 7 in which:
    said substrate is silicon.

* * * * *